United States Patent [19]
Kanda et al.

[11] Patent Number: 6,144,614
[45] Date of Patent: Nov. 7, 2000

[54] SEMICONDUCTOR INTEGRATED CIRCUIT HAVING A CLOCK AND LATCH CIRCUITS FOR PERFORMING SYNCHRONOUS SWITCHING OPERATIONS

[75] Inventors: Tatsuya Kanda; Hiroyoshi Tomita, both of Kawasaki, Japan

[73] Assignee: Fujitsu Limited, Kawasaki, Japan

[21] Appl. No.: 09/353,364

[22] Filed: Jul. 15, 1999

[30] Foreign Application Priority Data

Jul. 17, 1998 [JP] Japan ................................. 10-202394

[51] Int. Cl.⁷ .................................................. G11C 8/00
[52] U.S. Cl. ...................... 365/233; 365/230.08; 257/337
[58] Field of Search ............... 365/233, 230.08; 257/337

[56] References Cited

U.S. PATENT DOCUMENTS

| | | | |
|---|---|---|---|
| 5,812,491 | 9/1998 | Shinozaki et al. | 365/233 |
| 5,889,709 | 3/1999 | Fukuda | 365/189.05 |
| 5,890,186 | 3/1999 | Sato et al. | 711/3 |
| 5,953,284 | 9/1999 | Baker et al. | 365/233 |

*Primary Examiner*—David Nelms
*Assistant Examiner*—Connie C. Yoha
*Attorney, Agent, or Firm*—Arent Fox Kinter Plotkin & Kahn PLLC

[57] ABSTRACT

A semiconductor integrated circuit includes an internal clock generating circuit generating an internal clock, and a flip-flop circuit configured so that n latch circuits are cascaded via switch circuits performing switching operations in synchronism with the internal clock where n is an integer equal to or greater than 2. An initialization control circuit is provided so that it applies, after power on, an initialization signal to the flip-flop circuit whereby a first latch circuit among the n latch circuits is initialized. The initialization control circuit causes the internal clock generating circuit to generate the internal clock during a predetermined period so that the second through nth latch circuits are sequentially initialized.

14 Claims, 8 Drawing Sheets

FIG.3 *PRIOR ART*

SEMICONDUCTOR INTEGRATED CIRCUIT HAVING A CLOCK AND LATCH CIRCUITS FOR PERFORMING SYNCHRONOUS SWITCHING OPERATIONS

BACKGROUND OF THE INVENTION

1. Field of the Invention

The present invention relates to a semiconductor integrated circuit equipped with an internal clock generating circuit which generates an internal clock, and a flip-flop circuit in which a plurality of latch circuits are cascaded via switch circuits which perform switching operations in synchronism with the internal clock.

An example of semiconductor integrated circuits as described above is a SDRAM (Synchronous Dynamic Random Access Memory).

2. Description of the Related Art

FIG. 1 is a block diagram of a conventional SDRAM. The SDRAM includes DRAM cores 1-1 and 1-2, a clock buffer 2, and a command decoder 3. The clock buffer 2 is used to receive an external clock CLK and a clock enable signal CKE. The command decoder 3 decodes a command defined by, for example, a chip select signal /CS, a row address strobe signal /RAS, a column address strobe signal /CAS and a write enable signal /WE.

The SDRAM includes an address buffer 4, and an I/O buffer 5. The address buffer is used to receive row and column address signals A0–A10 and a bank address signal A11. The I/O data buffer 5 is used to input and output I/O data DQ0–DQ3. A symbol DQM is an I/O data mask signal for masking I/O data.

The SDRAM includes control signal latch circuits 6-1 and 6-2, a mode register 7, and column address counters 8-1 and 8-2. The mode register 7 is used to make the setting of a CAS latency and a burst length. The column address counters 8-1 and 8-2 output column addresses depending on the burst length.

FIG. 2 is a block diagram specifically illustrating the clock buffer 2, the command decoder 3 and the control signal latch circuit 6-1 shown in FIG. 1. The clock buffer 2 includes an input buffer 10 for inputting the external clock CLK, and an input buffer 11 for inputting the clock enable signal CKE. The input buffer 10 is controlled so that the external clock CLK is input only when the clock enable signal CKE is at a high level.

The control signal latch circuit 6-1 includes an internal clock generating circuit 12 and a flip-flop circuit 13. The internal clock generating circuit 12 generates an internal clock Int-CLK synchronized with an incoming external clock CLK1 during a period in which the internal clock is needed. The flip-flop circuit 13 is used to latch an internal signal in synchronism with the internal clock Int-CLK and transfer the latched internal signal to the DRAM core 1-1. The flip-flop 13 is initialized by a power-on reset signal POR, which is set to the high level at the time of power on.

FIG. 3 is a circuit diagram of the flip-flop circuit 13, which is made up of four latch circuits 15, 18, 21, and 24. The latch circuit 15 is made up of a NOR circuit 16 and an inverter 17. The latch circuit 18 is made up of a NAND circuit 19 and an inverter 20. The latch circuit 21 is made up of a NOR circuit 22 and an inverter 23. The latch circuit 24 is made up of a NAND circuit 25 and an inverter 26.

The flip-flop circuit 13 also includes switch circuits 27, 30, 33 and 36. The switch circuit 27 is made up of a p-channel MOS (pMOS) transistor 28 and an n-channel (nMOS) transistor 29. The switch circuit 30 is made up of an nMOS transistor 31 and a pMOS transistor 32. The switch circuit 33 is made up of a pMOS transistor 34 and an nMOS transistor 35. The switch circuit 36 is made up of an nMOS transistor 37 and a pMOS transistor 38.

Further, the flip-flop circuit 13 includes inverters 39, 40 and 41. The inverter 39 inverts the power-on reset signal POR. The inverter 40 inverts the internal clock signal Int-CLK and thus controls on/off of the nMOS transistor 29 and 35 and the pMOS transistors 32 and 38. The inverter 41 inverts the output signal of the inverter 40 and thus controls on/off of the pMOS transistors 28 and 34 and the nMOS transistors 31 and 37.

In the SDRAM thus constructed, when a power supply voltage VCC rises at the time of power on, the power-on reset signal POR switches to the high level. Thus, in the flip-flop circuit 13, the output signals of the NOR circuits 16 and 22 are switched to the low level, and the output signals of the inverters 17 and 23 are switched to the high level. Thus, the latch circuits 15 and 21 are initialized, and nodes N1 and N3 are fixed to the low level, as shown in FIG. 4.

Further, the output signal of the inverter 39 is switched to the low level, and the output signals of the NAND circuits 19 and 25 are switched to the high level. Furthermore, the output signals of the inverters 20 and 26 are switched to the low level. Thus, the latch circuits 18 and 24 are initialized, and nodes N2 and N4 are fixed to the high level, as shown in FIG. 4.

That is, in the conventional SDRAM shown in FIG. 1, the internal clock Int-CLK is fixed to the low level or the high level until the internal clock Int-CLK is needed after the power supply voltage VCC rises at the time of power on in order to reduce power consumption. In the above case, if the levels of the nodes N1–N4 in the flip-flop circuit 13 are not fixed, the flip-flop circuit 13 will operate unstably and thus erroneous data may be output. In order to prevent occurrence of such erroneous data, the levels of the nodes N1–N4 are defined by the power-on reset signal POR.

However, the use of the power-on reset signal POR for defining the potential levels of the nodes N1–N4 needs the NOR circuits 16 and 22 for configuring the latch circuits 15 and 21 and the NAND circuits 19 and 25 for configuring the latch circuits 18 and 24. This increases the chip area and power consumption.

SUMMARY OF THE INVENTION

It is a general object of the present invention to provide a semiconductor integrated circuit in which the above disadvantages are eliminated.

A more specific object of the present invention is to provide as semiconductor integrated circuit having a reduced chip area and a reduced power consumption.

The above objects of the present invention are achieved by a semiconductor integrated circuit comprising: an internal clock generating circuit generating an internal clock; a flip-flop circuit in which n latch circuits are cascaded via switch circuits performing switching operations in synchronism with the internal clock where n is an integer equal to or greater than 2; and a first initialization control circuit which applies, after power on, an initialization signal to the flip-flop circuit so that a power latch circuit among the n latch circuits is initialized and which causes the internal clock generating circuit to generate the internal clock during a predetermined period so that the second through nth latch circuits are sequentially initialized. With the above configuration, each of the nth latch circuit can be formed of two inverters that are cross-connected.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to FIGS. 5 through 9, of a semiconductor integrated circuit according to a first embodiment of the present invention.

Figure 1:
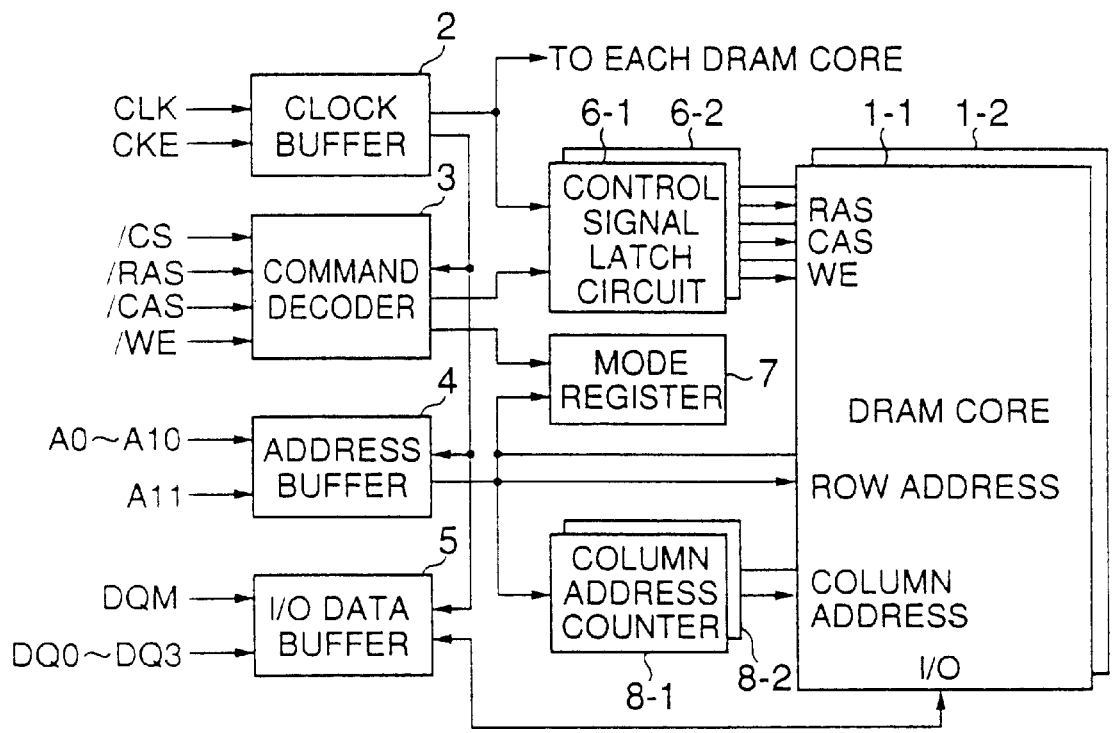
FIG. 1 is a block diagram of a conventional SDRAM.
Figure 2:
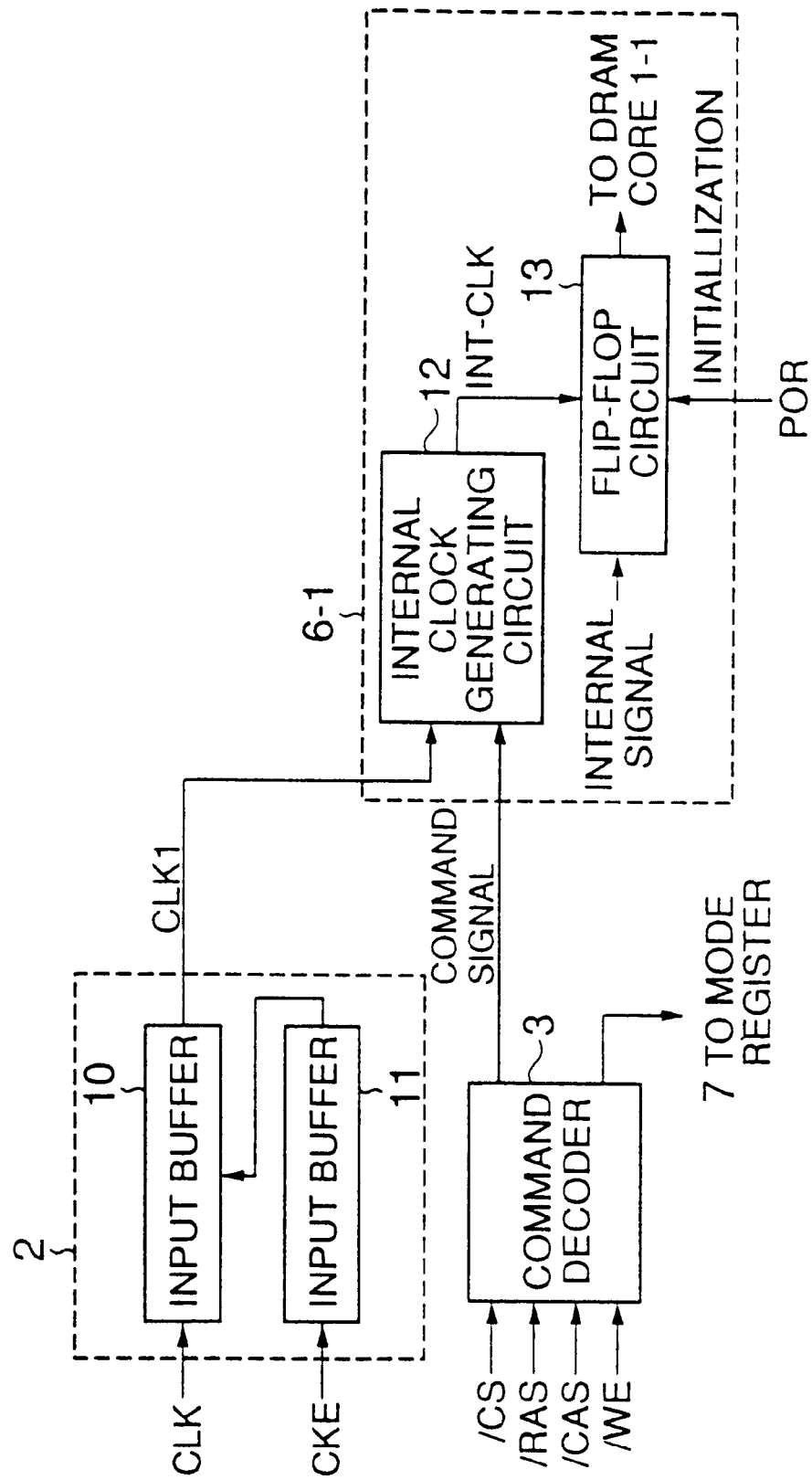
FIG. 2 is a block diagram of a clock buffer, a command decoder and a control signal latch circuit shown in FIG. 1.
Figure 3:
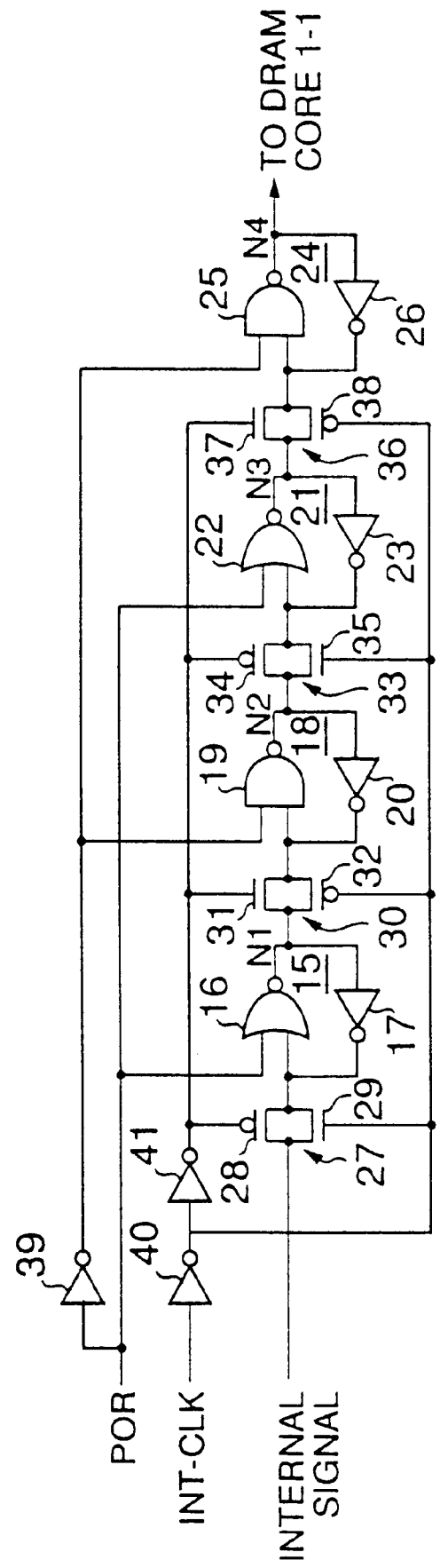
FIG. 3 is a circuit diagram of a flip-flop circuit shown in FIG. 1.
Figure 4:
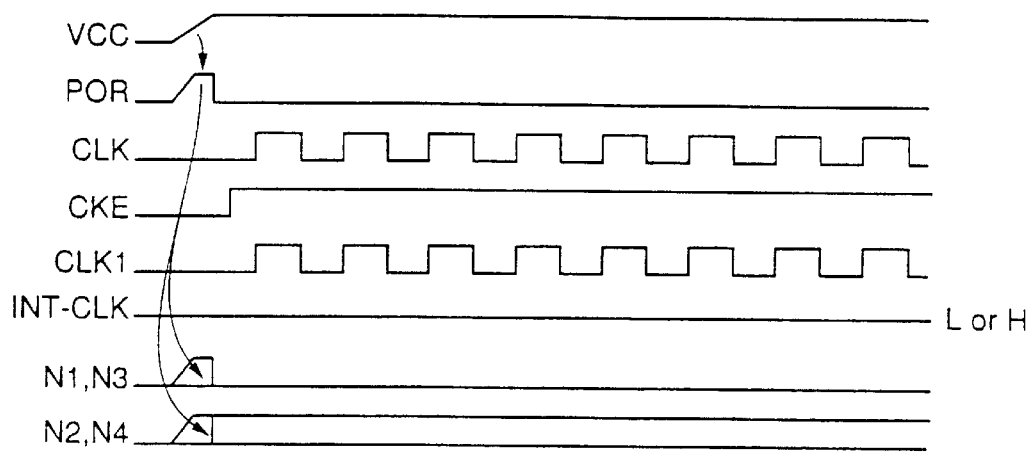
FIG. 4 is a timing chart of an operation of the conventional SDRAM shown in FIG. 1.
Figure 5:
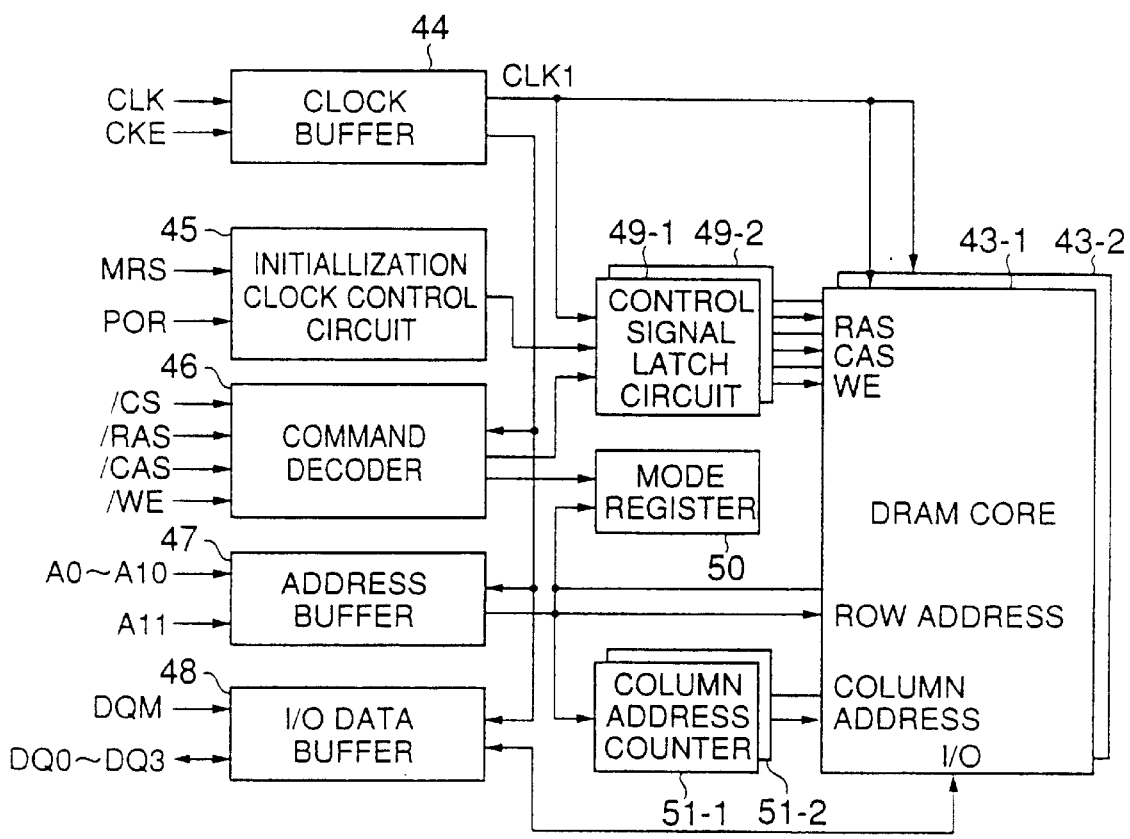
FIG. 5 is a block diagram of a semiconductor integrated circuit according to a first embodiment of the present invention.

FIG. 5 is a circuit diagram of an SDRAM to which the present invention is applied. The SDRAM shown in FIG. 5 includes DRAM cores 43-1 and 43-2, and a clock buffer 44 used to input the external clock and the clock unable signal CKE. The SDRAM includes an initialization clock control circuit 45, which inputs a mode register set command MRS and the power-on reset signal. The SDRAM includes a command decoder 46, which decodes a command defined by control signals such as the chip select signal /CS, the row address strobe signal /RAS, the column address strobe signal /CAS, and the write enable signal /WE. The SDRAM includes an address buffer, which inputs the row and column address signals A0–A10 and the bank address signal A11. The SDRAM includes an I/O data buffer used to input and output I/O data DQ1–DQ3.

The SDRAM includes control signal latch circuits 49-1 and 49-2, a mode register 50, and column address counters 51-1 and 51-2. The mode register 50 is used to set the CAS latency and the burst length. The column address counters 51-1 and 51-2 outputs the column addresses corresponding to the bank length.

Figure 6:
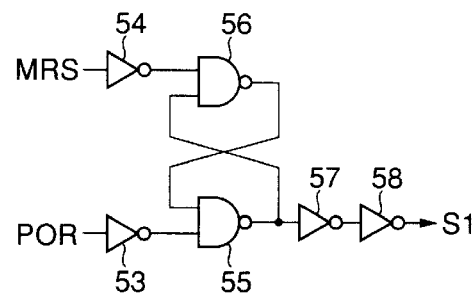
FIG. 6 is a circuit diagram of a configuration of an initialization clock control circuit shown in FIG. 5.

FIG. 6 is a circuit diagram of the initialization clock control circuit 45, which is made up of inverters 53 and 54, two-input NAND circuits 55 and 56, and inverters 57 and 58. The inverter 53 inverts the power-on reset signal. The inverter 54 inverts the mode register set command MRS. The NAND circuits 55 and 56 form a flip-flop. The inverters 57 and 58 are connected in series, and derive an internal clock control signal S1 from the output signal of the NAND circuit 55.

When the power-on reset signal POR switches to the high level at the time of power on, the output signal of the inverter 53 is switched to the low level, and the output signal of the NAND circuit 55 is switched to the high level. Further, the internal clock control signal S1 is switched to the high level. When the mode register set command MRS then switches to the high level, the output signal of the inverter 54 is switched to the low level, and the output signal of the NAND circuit 56 is switched to the high level. Further, the output signal of the NAND circuit 55 is switched to the low level and the internal clock control signal S1 is switched to the low level.

Figure 7:
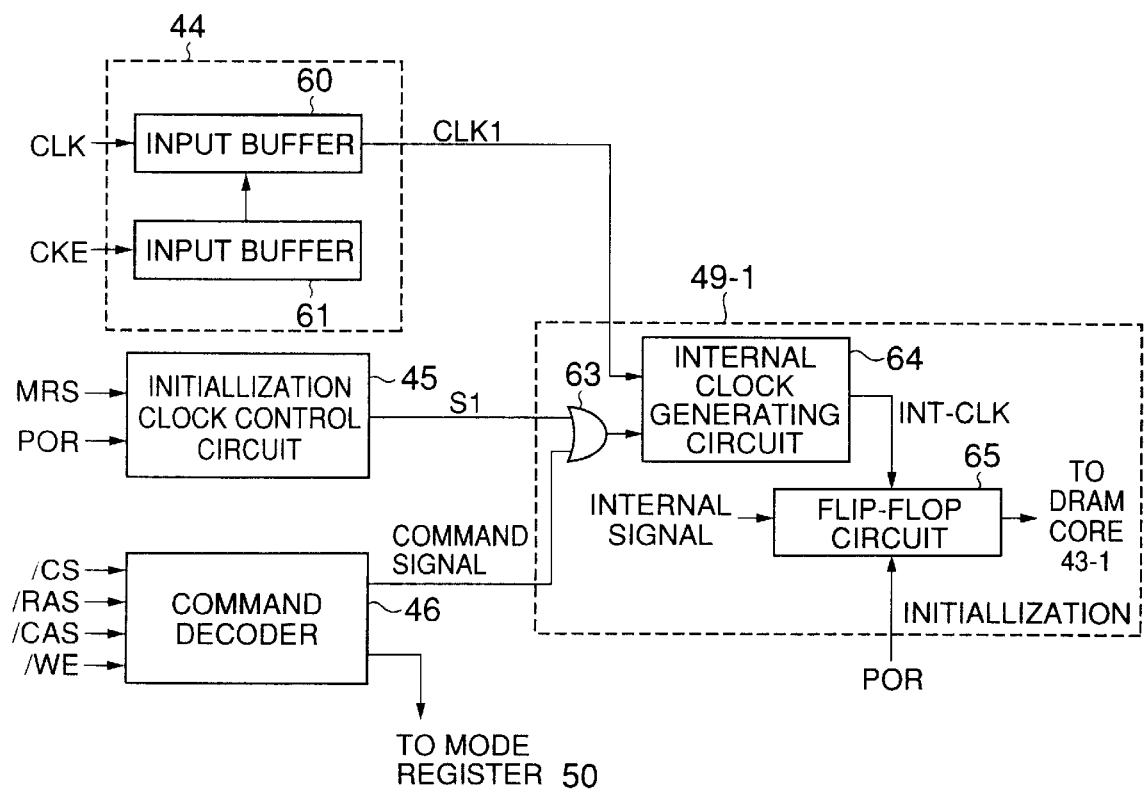
FIG. 7 is a block diagram of parts of the semiconductor integrated circuit shown in FIG. 5.

FIG. 7 is a block diagram of the clock buffer 44, the initialization clock control buffer 45, the command decoder 46 and the control signal latch circuit 49-1 shown in FIG. 6. The block buffer 44 includes input buffers 60 and 61. The input buffer 60 receives the external clock CLK, and the input buffer 61 receives the clock enable signal CKE. When the clock enable signal CKE is at the low level, the low-level output signal is applied to the input buffer 60. When the clock enable signal CKE is at the high level, the high-level output signal is applied to the input buffer 60. When the clock enable signal CKE is at the low level, that is, when the output signal of the input buffer 61 is at the low level, the input buffer 60 does not latch the external clock CLK. In contrast, when the clock enable signal CKE is at the high level, that is, when the output signal of the input buffer 61 is at the high level, the input buffer 60 latches the external clock CLK. The external clock CLK output by the input buffer 60 is applied to the control signal latch circuit 49-1 as CLK1.

The control signal latch circuit 49-1 is made up of an OR circuit 63, an internal clock generating circuit 64, and a flip-flop circuit 65. The OR circuit 63 performs an OR operation on the internal clock control signal S1 and the decoded command signal from the command decoder 46. The command signal is maintained at the high level during a period in which the internal clock Int-CLK is needed for execution of the command, for example, until the precharge command is input after the active command is input. During the periods other than the above-mentioned period, the command signal is maintained at the low level.

The internal clock generating circuit 64 generates the internal clock Int-CLK synchronized with the external clock CLK1 as long as the output signal of the OR circuit 63 is at the high level, that is, only when the internal clock control signal S1 is at the high level or the command signal output from the command decoder 46 is at the high level.

The flip-flop circuit 65 latches an internal signal in synchronism with the internal clock Int-CLK, and transmits the latched internal signal to the DRAM core 43-1. The flip-flop circuit 65 is reset by the power-on reset signal POR and the internal clock Int-CLK.

Figure 8:
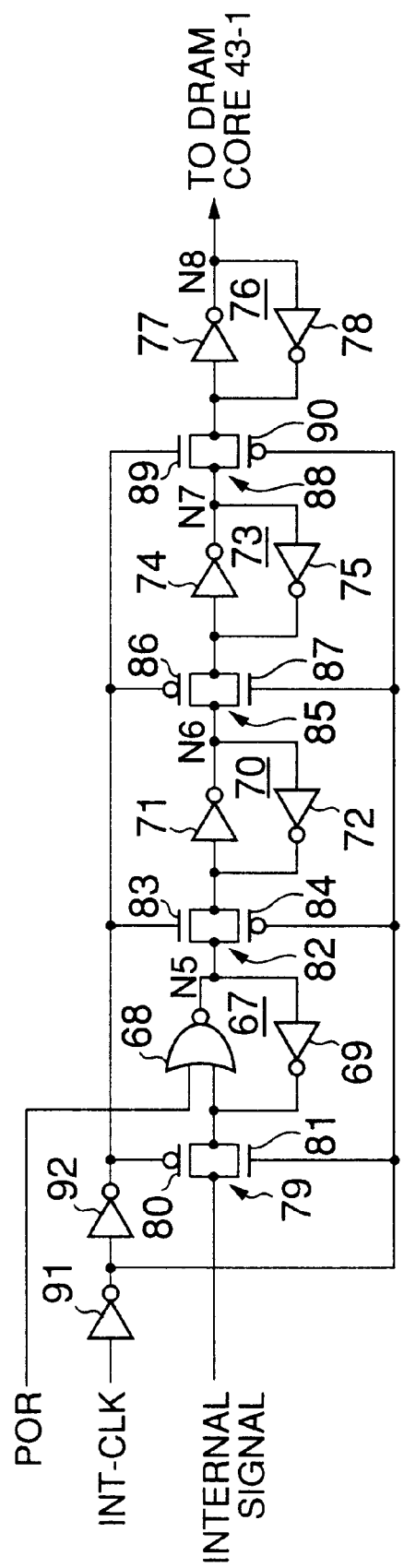
FIG. 8 is a circuit diagram of a flip-flop circuit shown in FIG. 7.

FIG. 8 is a circuit diagram of the flip-flop circuit 65, which includes latch circuits 67, 70 and 73. The number of latch circuits of the flip-flop circuit 65 is not limited to 3, and may include n latch circuits where n is an integer equal to or greater than 2. The latch circuit 67 is made up of the NOR circuit 68 and the inverter 69. The latch circuit 70 is made up of a NOR circuit 68 and an inverter 69. The latch circuit 70 is made up of inverters 71 and 72. The latch circuit 73 is made up of inverters 74 and 75.

The flip-flop circuit 65 includes switch circuits 79, 82, 85 and 88. The switch circuit 79 is made up of a pMOS transistor 80 and an nMOS transistor 81. The switche circuit 82 is made up of an nMOS transistor 83 and a pMOS transistor 84. The switch circuit 85 is made up of a pMOS transistor 86 and an nMOS transistor 87. The switch circuit 88 is made up of an nMOS transistor 89 and a pMOS transistor 90.

Further, the flip-flop circuit 65 includes inverters 91 and 92. The inverter 91 inverts the internal clock Int-CLK and thus controls on/off of the nMOS transistors 81 and 87 and the pMOS transistors 84 and 90. The inverter 92 inverts the output signal of the inverter 91 and thus controls on/off of the pMOS transistors 80 and 86 and the nMOS transistors 83 and 89.

Figure 9:
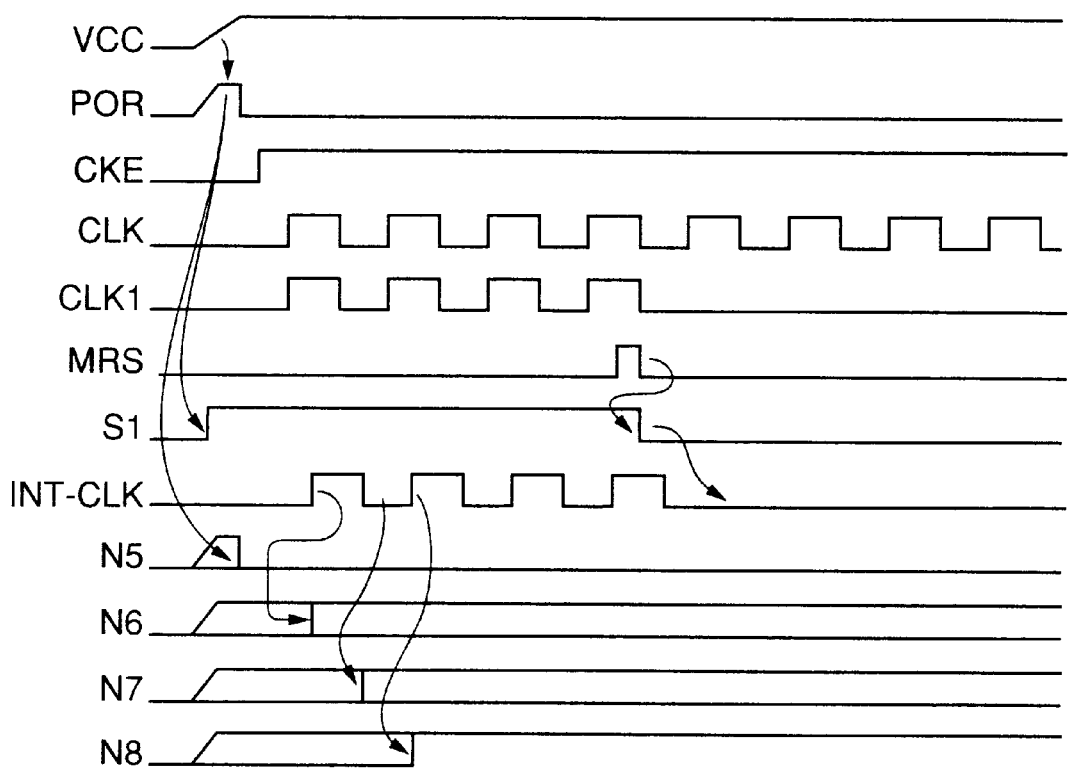
FIG. 9 is a waveform diagram illustrating an operation of the first embodiment of the present invention.

FIG. 9 is a waveform diagram of an operation of the first embodiment of the present invention. When the power-on reset circuit POR switches to the high level at the time of power on, the flip-flop 65 operates as follows. The output signal of the NOR circuit 68 is switched to the low level, and the output signal of the inverter 69 is switched to the high level. Thus, the latch circuit 67 is initialized, and a node N5 is fixed to the low level.

When the power-on reset signal POR switches to the high level, the internal clock control signal S1 is switched to the high level, and the OR circuit 63 of the control signal latch circuit 49-1 changes its output to the high level. Thus, the internal clock generating circuit 64 is changed to a state in which the internal clock Int-CLK is generated.

When the clock enable signal CKE changes to the high level after power on, the input buffer 60 inputs the external clock CLK, and the internal clock generating circuit 64 generates the internal clock Int-CLK in synchronism with the external clock CLK1.

When the internal clock Int-CLK changes to the high level, the flip-flop circuit 65 operates as follows. The nMOS transistor 83 is turned on, and the pMOS transistor 84 is turned on. The outputs of the inverters 71 and 72 are respectively high and low. Thus, the latch circuit 70 is initialized and a node N6 is fixed to the high level.

When the internal clock signal Int-CLK then changes to the low level, the flip-flop circuit 65 operates as follows. The pMOS transistor 86 is turned on, and the nMOS transistor 87 is turned on. The outputs of the inverters 74 and 75 are respectively low and high. Thus, the latch circuit 73 is initialized and a node N7 is fixed to the low level.

When the internal clock signal Int-CLK then changes to the high level, the flip-flop 65 operates as follows. The nMOS transistor 89 is turned on and the pMOS transistor 90 is turned on. The outputs of the inverters 77 and 78 are respectively high and low. Thus, the latch circuit 76 is initialized and a node N8 is fixed to the high level.

When the mode register command is then input, and the mode register set command signal MRS changes to the high level, the internal clock control signal S1 is switched to the low level. In the control signal latch circuit 49-1, the output signal of the OR circuit 63 is changed to the low level. Even when the clock enable signal CKE is at the high level, the internal clock generating circuit 64 stops generating the internal clock Int-CLK. Hence, power can be prevented from being consumed wastefully.

According to the first embodiment of the present invention, the latch circuit 67 is initialized by the power-on reset signal POR after power on, and thereafter the internal clock generating circuit 64 is allowed to generate the internal clock Int-CLK. Thus, the latch circuits 70, 73 and 76 are sequentially initialized, so that internal potentials in the flip-flop circuit 65 immediately after power on are defined.

That is, the internal potentials in the flip-flop circuit 65 immediately after power on can be defined even in the configuration in which each of the latch circuits 70, 73 and 76 are formed of two inverters that are cross-connected. Thus, the number of transistors necessary to form the flip-flop circuit 65 can be reduced, as compared with the conventional configuration. Further, there is no need to provide signal lines for transferring the power-on reset circuit POR to the latch circuits 70, 73 and 76.

Hence, according to the first embodiment of the present invention, the flop-flop circuit 65 and other analogous flip-flop circuits in the SDRAM can be realized by a reduced chip area and improved so that consume reduced power. Thus, the SDRAM can be realized by a reduced chip area and improved so as to consume reduced power.

Figure 10:
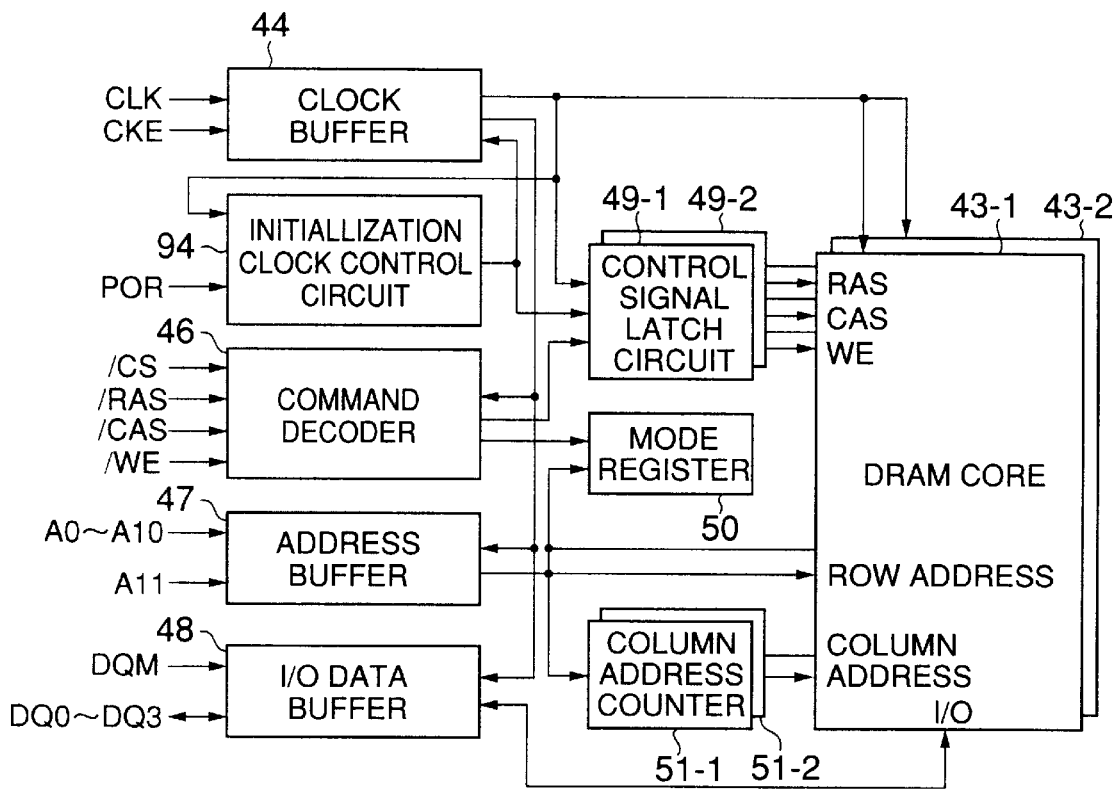
FIG. 10 is a block diagram of a second embodiment of the present invention.

A description will now be given, with reference to FIGS. 10 and 11, of a second embodiment of the present invention. The second embodiment of the present invention differs from the first embodiment thereof in only that the second embodiment is equipped with an initialization clock control circuit 94 having a configuration different from that of the aforementioned initialization clock control circuit 45 used in the first embodiment.

Figure 11:
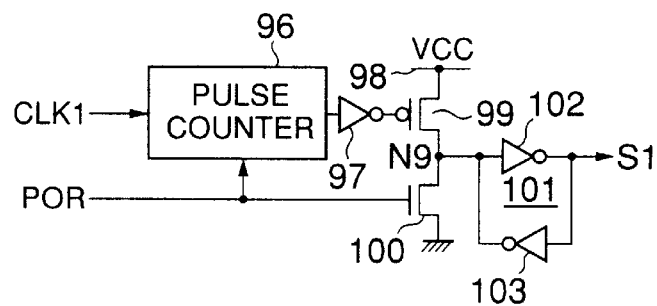
FIG. 11 is a block diagram of an initialization clock control circuit shown in FIG. 10.

FIG. 11 is a circuit diagram of the initialization clock control circuit 94, which includes a pulse counter 96, an inverter 96, a pMOS transistor 99, an nMOS transistor 100, and a latch circuit 101. The pulse counter 96 counts the number of pulses of the external clock CLK1, and is reset when the power-on reset signal POR switches to the high level. The output signal of the pulse counter 96 that is in the reset state is at the low level. When the count value of the pulse counter 96 becomes equal to 4, the pulse counter 96 outputs the high-level signal.

The inverter 97 inverts the output signal of the pulse counter 96. A power supply line 98 which carries the power supply voltage VCC is connected to the source of the pMOS transistor 99, which is turned on/off by the output signal of the inverter 97. The drain of the nMOS transistor 100 is connected to that of the pMOS transistor 99, and the source thereof is grounded. The nMOS transistor 100 is turned on/off by the power-on reset signal POR. The latch circuit 101 is made up of inverters 102 and 103. The latch circuit 101 inverts the level of a node N9 in which the drains of the pMOS transistor 99 and the nMOS transistor 100 are connected together. The output signal of the latch circuit 101 forms the internal clock control signal S1.

When the power-on reset signal POR changes to the high level at the time of power on, the output signal of the pulse counter 96 is at the low and the output signal of the inverter 97 is high. Further, the pMOS transistor 99 is OFF and the nMOS transistor 100 is turned ON. Hence, the level of the node N9 becomes low, and the internal clock control signal S1 is at the high level.

After that, when the power-on reset signal POR changes to the low level, and the nMOS transistor 100 is OFF. After that, when the count value of the pulse counter 96 becomes equal to 4, the output signal of the pulse counter 96 is changed to the high level, and the output signal of the inverter 97 is changed to the low level. Thus, the pMOS transistor 99 is turned ON. Thus, the level of the node N9 is switched to the high level, and the internal clock control signal S1 is changed to the low level.

Hence, according to the second embodiment present invention, as in the case of the first embodiment thereof, the latch circuit 67 is initialized by the power-on reset signal POR after power on, and thereafter the internal clock generating circuit 64 is allowed to generate the internal clock Int-CLK. Thus, the latch circuits 70, 73 and 76 are sequentially initialized, so that internal potentials in the flip-flop circuit 65 immediately after power on are defined.

That is, the internal potentials in the flip-flop circuit 65 immediately after power on can be defined even in the configuration in which each of the latch circuits 70, 73 and 76 are formed of two inverters that are cross-connected. Thus, the number of transistors necessary to form the flip-flop circuit 65 can be reduced, as compared with the conventional configuration. Further, there is no need to provide signal lines for transferring the power-on reset circuit POR to the latch circuits 70, 73 and 76.

Hence, according to the second embodiment of the present invention, the flip-flop circuit 65 and other analogous flip-flop circuits in the SDRAM can be realized by a reduced chip area and improved so that consume reduced power. Thus, the SDRAM can be realized by a reduced chip area and improved so as to consume reduced power.

In the first and second embodiments of the present invention are directed to the SDRAM. However, the present invention includes semiconductor integrated circuits equipped with an internal clock generating circuit and a flip-flop circuit in which a plurality of latch circuits are cascaded via switch circuits that perform switching operations in synchronism with an internal clock.

The MOS transistors used in the first and second embodiments of the present invention may be replaced by another type of field effect transistors such as insulated-gate field effect transistors.

The present invention is not limited to the specifically disclosed embodiments, and variations and modifications may be made without departing from the scope of the present invention.

What is claimed is:

1. A semiconductor integrated circuit comprising:
   an internal clock generating an internal clock;
   a flip-flop circuit in which n latch circuits are cascaded via switch circuits performing switching operations in synchronism with the internal clock where n is an integer equal to or greater than 2; and
   a first initialization control circuit which applies, after power on, an initialization signal to the flip-flop circuit so that a first latch circuit among the n latch circuits is initialized to a logic level defined by said initialization signal and which causes the internal clock generating circuit to generate the internal clock during a predetermined period so that the second through nth latch circuits are sequentially initialized.

2. The semiconductor integrated circuit as claimed in claim 1, wherein the first latch circuit receives, as the initialization signal, a reset signal generated in an internal circuit of the semiconductor integrated circuit at the time of power on.

3. The semiconductor integrated circuit as claimed in claim 1, wherein the predetermined period is a period until a given signal is externally applied or a predetermined number of pulses of the internal clock is generated.

4. The semiconductor integrated circuit as claimed in claim 1, wherein the semiconductor integrated circuit is a synchronous dynamic random access memory.

5. The semiconductor integrated circuit as claimed in claim 1, further comprising:
   a second initialization control circuit which applies, as the initialization signal, a power-on reset signal to the first latch circuit; and
   a third initialization control circuit which controls the internal clock generating circuit to generate the internal clock during the predetermined period when the power-on reset signal is generated.

6. The semiconductor integrated circuit as claimed in claim 5, wherein said third initialization control circuit comprises:
   an initialization clock control circuit which generates an internal clock control signal so that the internal clock control signal is at an active level when the power-on reset signal is generated and is at an inactive level when a mode register set command signal is at an active level; and
   a control circuit which causes the internal clock generating circuit to generate the internal clock as long as the internal clock control signal is at the active level.

7. The semiconductor integrated circuit as claimed in claim 6, wherein the initialization clock control circuit receives the power-on reset signal and the mode register set command and operates so as to change the internal clock control signal to the active level when the power-on reset signal switches to the active level and change the internal clock control signal to the inactive level when the mode register set command switches to the active level.

8. The semiconductor integrated circuit as claimed in claim 7, wherein the initialization clock control circuit comprises:
   a first inverter inverting the power-on reset signal;
   a second inverter inverting the mode register set command;
   a first NAND circuit having a first input terminal receiving an output signal of the first inverter, and a second input terminal;
   a second NAND circuit having a first input terminal receiving an output signal of the second inverter, and a second input terminal receiving an output signal of the first NAND circuit, an output signal of the second NAND circuit being applied to the second input terminal of the first NAND circuit.

9. The semiconductor integrated circuit as claimed in claim 5, wherein said third initialization control circuit comprises:
   an initialization clock control circuit which generates an internal clock control signal so that the internal clock control signal is at an active level when the power-on reset signal is generated and is at an inactive level when a given number of pulses of the internal clock is generated; and
   a cover circuit which causes the internal clock generating circuit to generate the internal clock as long as the internal clock control signal is at the active level.

10. The semiconductor integrated circuit as claimed in claim 9, wherein the initialization clock control circuit has a configuration which switches the internal clock control signal to the active level when the power-on reset signal is generated and to the inactive level when the given number of pulses of the internal clock is counted.

11. The semiconductor integrated circuit as claimed in claim 10, wherein the initialization clock control circuit comprises:
   a counter which is initialized by the power-on reset signal so that an output of the counter is changed to a first logic level, said counter counting an external clock and changing the output thereof to a second logic level; and
   a control signal which generates the internal clock so that the internal clock control signal is switched to the active level when the power-on reset signal is generated and is switched to the inactive level when the output of said counter becomes the second logic level.

12. The semiconductor integrated circuit as claimed in claim 11, wherein said control circuit comprises:
   a p-channel field effect transistor having a source connected to a power supply line and operating so that it turns off when the output of said counter becomes the first logic level and turns on when the output of said counter becomes the second logic level;

an n-channel field effect transistor having a drain connected to that of the p-channel field effect transistor, and a source that is grounded, and being turned on/off by the power-on reset signal; and a latch circuit inverting a level of a connection node in which the drains of the p-channel and n-channel field effect transistors are connected together and latching an inverted level.

13. The semiconductor integrated circuit as claimed in claim 6, wherein said control circuit causes the internal clock generating circuit to generate the internal clock when the internal clock is needed for execution of a command.

14. The semiconductor integrated circuit as claimed in claim 1, wherein said internal clock generating circuit has a configuration so that the internal clock is generated in synchronism with an external clock when said internal clock generating circuit is in an active state.

* * * * *